United States Patent [19]
Johnson

[11] Patent Number: 5,451,898
[45] Date of Patent: Sep. 19, 1995

[54] BIAS CIRCUIT AND DIFFERENTIAL AMPLIFIER HAVING STABILIZED OUTPUT SWING

[75] Inventor: Mark G. Johnson, Los Altos, Calif.

[73] Assignee: Rambus, Inc., Mountain View, Calif.

[21] Appl. No.: 151,513

[22] Filed: Nov. 12, 1993

[51] Int. Cl.⁶ .................. H03K 5/24; H03K 17/16
[52] U.S. Cl. .................. 327/563; 327/538; 327/53; 327/65; 330/253; 330/261
[58] Field of Search ............ 307/491, 494; 330/261, 330/253, 257, 259; 327/563, 543, 538, 519, 378, 535, 65, 63, 80, 82, 52, 53, 54

[56] References Cited
U.S. PATENT DOCUMENTS

| | | | |
|---|---|---|---|
| 3,719,833 | 3/1973 | Free | 327/538 |
| 4,538,114 | 8/1985 | Kunimi et al. | 330/253 |
| 4,794,349 | 12/1988 | Senderowicz et al. | 330/261 |
| 4,956,613 | 9/1990 | Hosticka et al. | 330/261 |
| 4,959,621 | 9/1990 | Hosticka et al. | 330/253 |
| 5,124,580 | 6/1992 | Matthews et al. | 327/538 |
| 5,153,529 | 10/1992 | Koda et al. | 330/257 |
| 5,223,743 | 6/1993 | Nakagawara | 327/535 |
| 5,298,809 | 3/1994 | Yamaguchi | 307/491 |
| 5,362,995 | 11/1994 | Kubo | 327/63 |

Primary Examiner—John S. Heyman
Assistant Examiner—Terry L. Englund
Attorney, Agent, or Firm—Blakely, Sokoloff, Taylor & Zafman

[57] ABSTRACT

A differential circuit is provided that generates a differential output voltage $\Delta V$ that does not vary when the power supply voltage changes and/or when the field effect transistor conductance changes. The bias circuit connected to the differential amplifier stabilizes the output voltage swing $\Delta V$ to be insensitive to change in supply voltage and/or transconductance. A feedback loop is provided to drive the voltage to a predetermined voltage dependent upon the threshold voltage of the transistors used (e.g., the threshold voltage of a PMOS transistor). The voltage stabilizes the current source of the differential amplifier via a current mirror coupled to the feedback loop. Therefore, the resultant differential output voltage $\Delta V$ is equal to the transistor threshold voltage. As the transistor threshold voltage is independent of the power supply voltage and device transconductance, the differential amplifier output $\Delta V$ is stabilized against variations in power supply voltage and transconductance.

33 Claims, 3 Drawing Sheets

BIAS CIRCUIT AND DIFFERENTIAL AMPLIFIER HAVING STABILIZED OUTPUT SWING

BACKGROUND OF THE INVENTION

1. Field of the Invention

The present invention relates to the stabilization of a differential amplifier circuit that is insensitive to variations in supply voltage and transconductance.

2. Art Background

High performance integrated circuits often transmit and receive data differentially: two wires (e.g., data and dataB) sent one binary digit (bit). If the voltage on wire data is larger than the voltage on wire dataB, then the bit is a value of one. If the voltage on dataB is larger than the voltage on data, then the bit is a value of zero. This is called "differential signaling" because the voltage difference encodes the bit: one if the difference is positive, zero if the difference is negative.

Differential signaling can operate at very high speeds, because it allows the integrated circuit designer to use small voltage swings and yet retain good noise rejection. To operate at a high speed, the circuit delay ($\Delta t$) must be minimized. Delay is a function of the current (I) used to drive the signal wire, the capacitance (C) on the wire, and the voltage swing ($\Delta V$) selected by the integrated circuit designer:

$$\Delta t = C \times \frac{\Delta V}{I}$$

As can be seen, high speed (small $\Delta t$) may be achieved by reducing the capacitance C, increasing the current I, or reducing the voltage swing $\Delta V$. Unfortunately, it is usually impossible to reduce C; wires must travel long distances, transistor sizes cannot be decreased, etc. Similarly, it is often impractical or impossible to increase the driving current I, because that would raise power consumption to unacceptable levels. Therefore, integrated circuit designers usually must reduce delay be reducing voltage swing ($\Delta V$).

Reduced voltage swing can become problematic, though, because it also reduces noise rejection. The smaller the swing, the easier for noise to disturb or overpower the intended data signal. Differential signaling offers a substantial improvement as the noise is often equally coupled into both wires of a differential signal-pair and the voltage difference between the wires is therefore unaffected. This type of disturbance, called common-mode noise, is completely rejected by differential signaling. Because of its superior common-mode noise rejection, differential signaling can operate at much smaller voltage swing $\Delta V$ than nondifferential ("single ended") signaling.

However, integrated circuits encounter additional types of imbalances besides common-mode noise. Manufacturing tolerances cause pairs of elements, designed and intended to be "identical", to have slight mismatches. (The worse the tolerances, the worse the mismatch.) Mismatches can cause "differential driver" circuits and "differential receiver" circuits to favor one data state over the other, a condition know as offset. Additionally, noise can couple into one wire of a differential signal-pair more than it couples into the other wire; this is called differential-mode noise. Each of these mechanisms serves to disturb the data being sent on the differential pair, forcing the designer to use a larger voltage swing $\Delta V$ to be certain of reliable data transmission.

Thus, integrated circuit designers strive to balance conflicting requirements; use as small a voltage swing $\Delta V$ as possible (for small delay), but not too small (otherwise the data can be corrupted by mismatches and differential-mode noise).

Another factor which complicates the design process is that the voltage swing $\Delta V$ usually varies with supply voltage and field effect transistor "strength" (transconductance). Thus the designer must arrange the circuit so that under all possible conditions, the voltage swing $\Delta V$ never falls below the required minimum. The designer therefore adjusts the circuit so that under the worst-case conditions (which cause the smallest swing $\Delta V$), $\Delta V$ is still adequately large. The typical swing $\Delta V$, with nominal values of supply voltage and transistor strength, is larger than necessary. The larger swing means the circuit delay is bigger than it otherwise might be.

FIG. 1 shows a prior art differential amplifier and bias circuit. PMOS load transistors M1, M2 operate in the triode or "linear" region; the gates connect to VSS. The bias circuit consists of devices M6 and M7. These bias devices produce the gate voltage for the current source transistor M5 of the differential amplifier. The output voltage swing is given by $\Delta V = IR$, where I is the current source value (M5's drain current), and R is the effective resistance of the triode-load PMOS transistor (M1 and M2).

The output swing $\Delta V$ from this prior art circuit is not stabilized against variations in the supply voltage VDD. If VDD increases, the gate-to-source voltage of the PMOS loads M1 and M2 increases. Since M1 and M2 are in the linear region, the effective resistance R decreases linearly with VDD. However, the bias current through M6 and M7 increases super-linearly with VDD; in classical theory this current increases as the square of VDD since both M6 and M7 are saturated. (Modern short-channel devices, specifically PMOS transistors like M6, have currents that increase as approximately VDD to the power 1.4.) In any case, the super-linear increase in bias current I and the linear decrease in load resistance R, provides that the voltage swing $\Delta V = IR$ increases when VDD increases. Similarly, $\Delta V$ decreases when VDD decreases.

The output swing $\Delta V$ from this prior art circuit is also not stabilized against variations in device transconductance. Transconductance variations can arise in manufacturing, from variations in the line width of the transistor gate electrode, from differences in the gate oxide thickness, or from differences in the source/drain "underdiffusion" beneath the gate. If the transconductance of the NMOS transistors increases, while that of the PMOS transistors is unaffected, the current in bias stage M6, M7 increases and therefore current source transistor M5 sinks more current I. However, load transistors M1 and M2 are unaffected, so the resistance R remains unchanged. Therefore the voltage swing $\Delta V = IR$ increases. Similarly, $\Delta V$ decreases when NMOS transconductance increases.

SUMMARY OF THE INVENTION

It is therefore an object of the present invention to provide a differential amplifier and bias circuit which has a differential output voltage swing that is stabilized against variations in supply voltage and device transconductance.

A differential circuit is provided that generates a differential output voltage ΔV that does not vary when the power supply voltage changes and/or when the field effect transistor conductance changes. The bias circuit connected to the differential amplifier stabilizes the output voltage swing ΔV to be insensitive to change in supply voltage and/or transconductance. A feedback loop is provided to drive the voltage to a predetermined voltage dependent upon the threshold voltage of the transistors used (e.g., the threshold voltage of a PMOS transistor). The voltage stabilizes the current source of the differential amplifier via a current mirror coupled to the feedback loop. Therefore, the resultant differential output voltage ΔV is equal to the transistor threshold voltage. As the transistor threshold voltage is independent of the power supply voltage and device transconductance, the differential amplifier output ΔV is stabilized against variations in power supply voltage and transconductance.

BRIEF DESCRIPTION OF THE DRAWINGS

The objects, features and advantages of the present invention will be apparent to one skilled in the art from the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the invention. In other instances, well known electrical structures and circuits are shown in simplified or block diagram form in order not to obscure the present invention unnecessarily.

The differential amplifier is connected to a bias circuit which controls the differential output swing ΔV of the differential amplifier to be insensitive to changes in power supply voltage or transistor transconductance. The bias circuit includes a transistor load similar to the loads across the differential amplifier transistors, a feedback loop to maintain a predetermined voltage across the load of the bias circuit and therefore the load across the differential amplifier. A current mirror is also provided to provide a constant current value to the differential amplifier based upon the predetermined voltage across the load of the bias circuit as maintained by the feedback loop.

Figure 1:
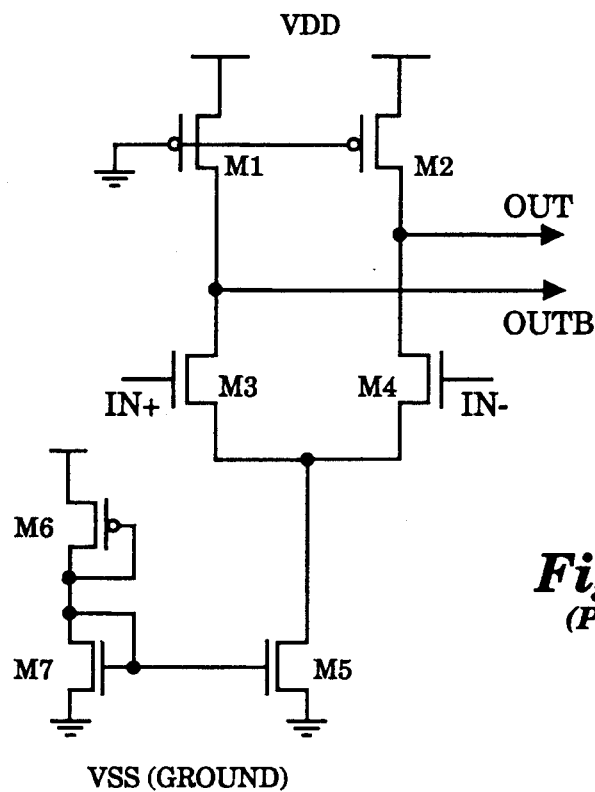
FIG. 1 is a circuit diagram illustrating a prior art differential amplifier and bias circuit.
Figure 2:
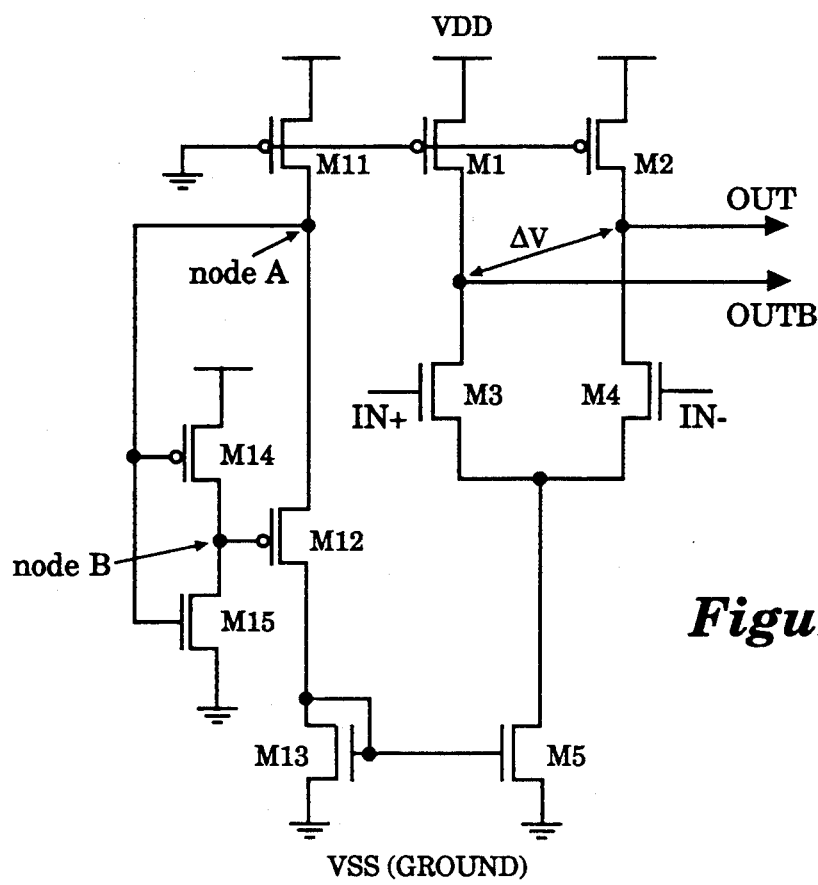
FIG. 2 is a circuit diagram illustrating one embodiment of the present invention.

One embodiment of the invention is shown in FIG. 2. Referring to FIG. 2, transistors M3 and M4 form a differential pair with current source M5. Devices M1 and M2 are load elements of the differential pair; together, M1–M5 constitute a differential amplifier. Transistors M11–M15 form the bias circuit which stabilizes the output voltage swing ΔV.

Bias transistor M11 shares the same gate and source connections as load transistors M1, M2. Preferably, M11 is the same size as M1 and M2. As shown in FIG. 2, the gate nodes of the bias transistor M11 and load transistors M1, M2 are connected to VSS (or ground); however, the gate nodes can also be connected to an alternate bias potential and still operate in accordance with the teachings of the present invention. Transistors M12, M14 and M15 are connected in a feedback loop which serves to stabilize node A (M11's drain) at $VDD - V_{TP}$ ($V_{TP}$ = the threshold voltage of the PMOS transistor M14). Preferably, M12 is made very large (W/L >> 1) to increase the gain of the feedback loop (where W represents the channel width and L represents the channel length).

For example, if node A were at a voltage greater than $(VDD - V_{TP})$, transistor M14 would be cut off, and M15 would be turned on. This functions to pull node B down to VSS, increasing the gate drive on M12, which increases the current flowing through M11–M13, and reduces the voltage at node A. Therefore, the circuit reacts to the situation [node A greater than $(VDD - V_{TP})$] by decreasing the voltage at node A.

If node A were at a voltage less than $(VDD - V_{TP})$, transistor M14 would be turned on. As $(W/L)_{14} >> (W/L)_{15}$, transistor M14 overpowers transistor M15 and node B is pulled up to VDD. This cuts off M12, allowing M11 to pull up the voltage at node A. Therefore, the circuit reacts to the situation [node A less than $(VDD - V_{TP})$] by increasing the voltage at node A.

If no data is present at the inputs IN+, IN−, inputs IN+ and IN− are equal and the current splits equally. Therefore, half of the current flows in M1 and half flows in M2. The outputs OUT and OUTB are at the potential $(VDD - V_{TP}/2)$ in this condition. However, in normal operation, data is present on the inputs; IN+ is higher than IN−, or vice versa. Therefore, all the current flows in one leg or in the other, so that OUT and OUTB are at VDD and $(VDD - V_{TP})$ or vice versa. It should be noted that the differential output voltage ΔV is equal to $V_{TP}$, the PMOS threshold voltage. Because $V_{TP}$ is independent of power supply voltage and device transconductance, the differential amplifier output ΔV is stabilized against variations in these two parameters.

In an alternate embodiment, the output voltage swing ΔV can be set to any desired multiple (or fraction) or $V_{TP}$ by adjusting the ratios of transistor sizes such that the voltage is a product of a constant and VTP. For example, the desired output swing can be set to $0.8 \times V_{TP}$ which is achieved by making M5 and M13 the same channel length L and setting $W_5 = 0.8 \times W_{13}$. An alternative approach to achieving this swing ΔV would be to set the channel width $W_{11} = 0.8 \times W_2$.

Figure 3:
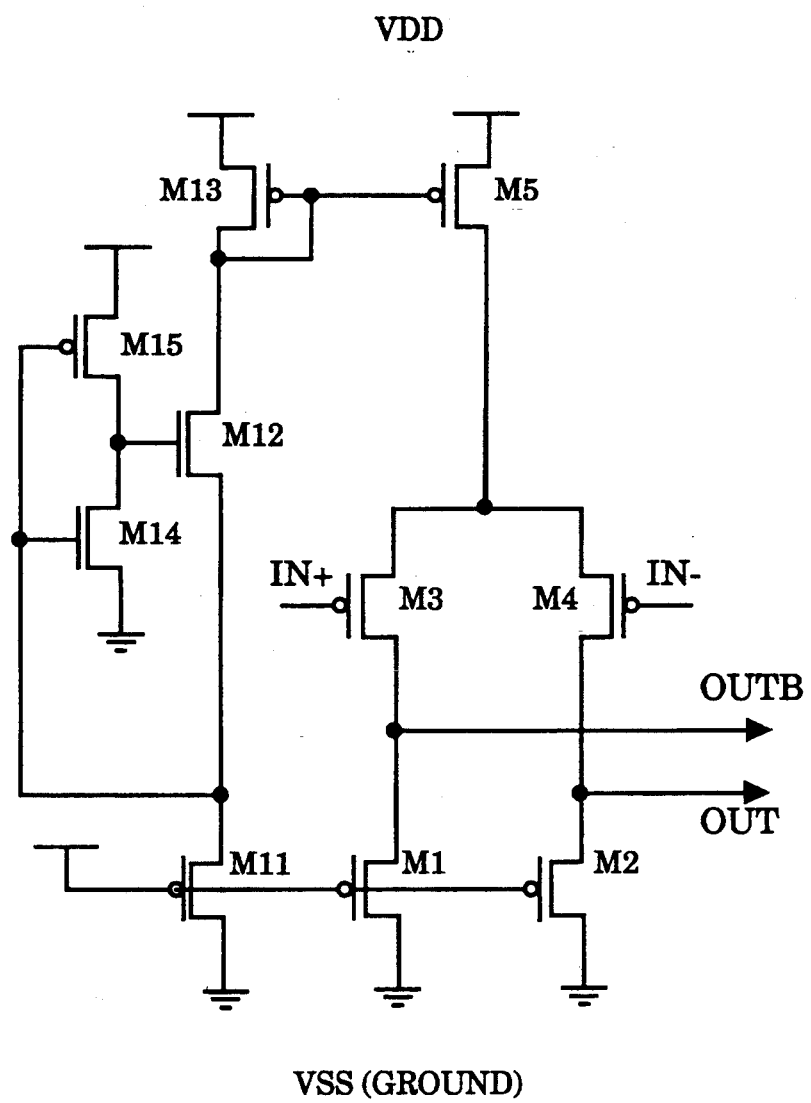
FIG. 3 is a circuit diagram illustrating an alternate embodiment of the present invention.

It is readily apparent that the circuit of the present invention may be used in complementary form. This is shown in FIG. 3.

Figure 4:
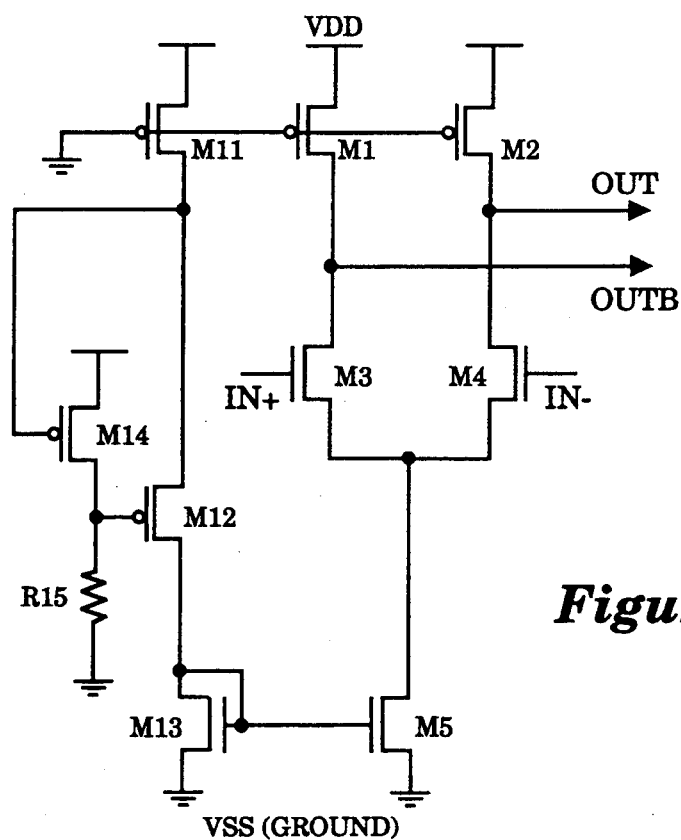
FIG. 4 is a circuit diagram illustrating an alternate embodiment of the present invention.
Figure 5:
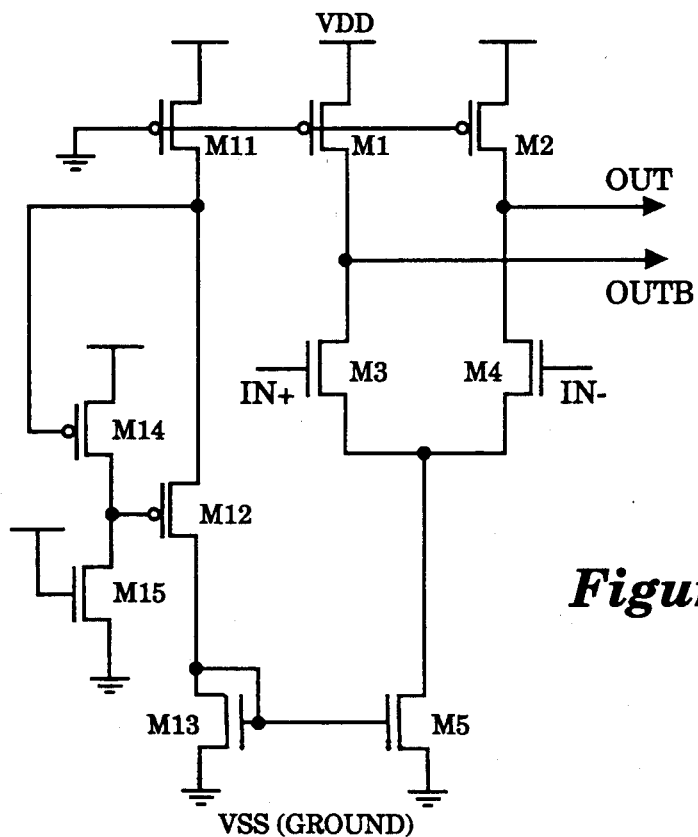
FIG. 5 is a circuit diagram illustrating an alternate embodiment of the present invention.

Various different mechanisms may be used to pull down node B; for example, alternately, a high-value in the range of at least $10^4$ ohms, preferably $10^5$ ohms resistor can be substituted for transistor M15. This is shown in the embodiment illustrated in FIG. 4. Furthermore, alternately, the gate of transistor M15 can be connected to some other circuit point besides node A, for example, VDD. This is illustrated in FIG. 5.

The invention has been described in conjunction with the preferred embodiment. It is evident that numerous alternatives, modifications, variations and uses will be apparent to those skilled in the art in light of the foregoing description.

What is claimed is:

1. A differential amplifier circuit which receives as input a first input voltage and a second input voltage and outputs a differential output voltage indicative of which input voltage is greater, said circuit comprising:
   a differential pair of transistors coupled to receive the first input voltage and second input voltage;
   first and second load transistors, each load transistor coupled between a first supply voltage and a respective transistor of the differential pair of transistors;
   first and second output nodes for providing the differential output voltage, said first output node coupled between a first transistor of the differential pair of transistors and the first load transistor and the second output node coupled between a second transistor of the differential pair of transistors and the second load transistor;
   a bias circuit comprising;
      a bias load transistor coupled to the first supply voltage, said transistor having gate, first and second nodes, the gate node of the bias load transistor being connected to gate nodes of the first and second load transistors and the first node coupled to the first supply voltage,
      a feedback loop coupled to the bias load transistor to maintain a predetermined voltage at said second node of the bias load transistor and a predetermined current through a feedback path loop, said feedback loop maintaining said predetermined voltage at the second node of the bias load transistor independent of variations of said first supply voltage and transconductance of transistors in the circuit, and
      a current mirror coupled to receive the current through the feedback path, said current mirror further coupled to the differential pair of transistors to provide a constant current value through said differential pair of transistors;
   wherein the differential output is stabilized against variations in supply voltage and transconductance of transistors in the circuit.

2. The differential amplifier circuit as set forth in claim 1, wherein the first and second load transistors and the bias load transistor are of the same size.

3. The differential amplifier circuit as set forth in claim 1, wherein the feedback loop comprises:
   a first feedback transistor having gate, first and second nodes, said first node coupled to the first supply voltage and said gate coupled to the second node of the bias load transistor;
   a second feedback transistor having gate, first and second nodes, said first node of the second feedback transistor coupled to the second node of the first feedback transistor, said second node of the second feedback transistor coupled to a second supply voltage; and
   a third feedback transistor having gate, first and second nodes, said first node of the third feedback transistor coupled to the second node of the bias load transistor, said second node of the third feedback transistor coupled to the current mirror, and the gate node of the third feedback transistor coupled to the first node of the second feedback transistor and the second node of the first feedback transistor.

4. The differential amplifier circuit as set forth in claim 3, wherein the gate node of the second feedback transistor is coupled to the second node of the bias load transistor.

5. The differential amplifier circuit as set forth in claim 3, wherein the gate node of the second feedback transistor is coupled to the first supply voltage.

6. The differential amplifier circuit as set forth in claim 1, wherein the predetermined voltage is equal to difference between the first supply voltage and a threshold voltage of a first feedback loop transistor.

7. The differential amplifier circuit as set forth in claim 1, wherein said current mirror comprises a first current mirror transistor and second current mirror transistor, each transistor having gate, first and second nodes, said gate nodes of each transistor coupled to the first node of the first current mirror transistor, said first node of the first current mirror transistor further coupled to the feedback loop to receive the current, said first node of the second current mirror transistor coupled to the differential pair of transistors, and said second nodes of the first current mirror transistor and second current mirror transistor coupled to a second supply voltage.

8. The differential amplifier circuit as set forth in claim 7, wherein the differential output voltage is adjusted to be a product of a constant and a threshold voltage of a feedback loop transistor, a channel width of said second current mirror transistor being equal to the product of the constant and the channel width of the first current mirror transistor.

9. The differential amplifier circuit as set forth in claim 7, wherein the differential output voltage is adjusted to be a product of a constant and a threshold voltage of a feedback loop transistor, a channel width of said bias load transistor being equal to the product of the constant and the channel width of the second load transistor of the differential pair of transistors.

10. The differential amplifier circuit as set forth in claim 1, wherein the feedback loop comprises:
   a first feedback transistor having gate, first and second nodes, said first node of the first feedback transistor coupled to the first supply voltage and said gate node of the first feedback transistor coupled to the second node of the bias load transistor;
   a resistor coupled between a second supply voltage and the second node of the first feedback transistor; and
   a second feedback transistor having gate, first and second nodes, said first node of the second feedback transistor coupled to the second node of the bias load transistor, said second node of the second feedback transistor coupled to the current mirror, and the gate node of the second feedback transistor coupled the second node of the first feedback transistor.

11. The differential amplifier as set forth in claim 10, wherein the resistor is of a value of at least $10^4$ ohms.

12. The differential amplifier circuit as set forth in claim 1, wherein the said first supply voltage is equal to a potential greater than ground.

13. The differential amplifier circuit as set forth in claim 12, wherein the first node of a transistor is a source node and the second node of a transistor is a drain node.

14. The differential amplifier circuit as set forth in claim 3, wherein the second supply voltage equals a ground potential, said first supply voltage is equal to a potential greater than ground, the first node of a transistor is a source node and the second node of a transistor is a drain node.

15. The differential amplifier circuit as set forth in claim 7, wherein the second supply voltage equals a ground potential, said first supply voltage is equal to a potential greater than ground, the first node of a transistor is a source node and the second node of a transistor is a drain node.

16. The differential amplifier circuit as set forth in claim 10, wherein the second supply voltage equals a ground potential, said first supply voltage is equal to a potential greater than ground, the first node of a transistor is a source node and the second node of a transistor is a drain node.

17. The differential amplifier circuit as set forth in claim 1, wherein the said first supply voltage is equal to a potential equal to ground.

18. The differential amplifier circuit as set forth in claim 17, wherein the first node of a transistor is a drain node and the second node of a transistor is a source node.

19. The differential amplifier circuit as set forth in claim 3, wherein the first supply voltage equals a ground potential, said second supply voltage is equal to a potential greater than ground, the first node of a transistor is a drain node and the second node of a transistor is a source node.

20. The differential amplifier circuit as set forth in claim 7, wherein the first supply voltage equals a ground potential, the first node of a transistor is a drain node and the second node of a transistor is a source node.

21. The differential amplifier circuit as set forth in claim 10, wherein the first supply voltage equals a ground potential, the first node of a transistor is a drain node and the second node of a transistor is a source node.

22. In a differential amplifier circuit comprising a pair of amplifier transistors having load transistors, said circuit receives as input a first input voltage and a second input voltage and outputs a differential output voltage indicative of which input voltage is greater, a bias circuit that stabilizes the differential output against variations in a first supply voltage and transistor transconductance, said bias circuit comprising:
   a bias load transistor approximately equal in size to sizes of the load transistors, a gate node of the bias load transistor coupled to gate nodes of the load transistors;
   a feedback loop to maintain a predetermined voltage at a first node of the bias load transistor and a current through a feedback path, said feedback loop maintaining said predetermined voltage at the first node of the bias load transistor independent of variations of said first supply voltage and transconductance of transistors in the circuit, and
   a current mirror coupled to the feedback loop to receive the current through the feedback path, said current mirror further coupled to the differential pair of transistors to provide a constant current value through said differential pair of transistors;
   wherein the differential output is stabilized against variations in said first supply voltage and transistor transconductance.

23. The bias circuit as set forth in claim 22, wherein a source node of the bias load is coupled to the first supply voltage.

24. The bias circuit as set forth in claim 22, wherein a drain node of the bias load is coupled to a second supply voltage.

25. The bias circuit as set forth in claim 22, wherein a drain node of the bias load is coupled to a supply voltage equal to ground potential.

26. The bias circuit as set forth in claim 22, wherein a source node of the bias load is coupled to a supply voltage at a potential greater than ground potential.

27. The differential amplifier circuit as set forth in claim 23, wherein the feedback loop comprises:
   a first feedback transistor having a gate, drain and source node, said source node of the first feedback transistor coupled to the supply voltage and said gate node of the first feedback transistor coupled to a drain node of the bias load transistor;
   a second feedback transistor having a gate, drain and source node, said source node of the second feedback transistor coupled to the drain node of the first feedback transistor, said drain node of the second feedback transistor coupled to a ground; and
   a third feedback transistor having a gate, drain and source node, said source node of the third feedback transistor coupled to the drain of the bias load transistor, said drain node of the third feedback transistor coupled to the current mirror, and the gate node of the third feedback transistor coupled to the source node of the second feedback transistor and the drain node of the first feedback transistor.

28. The differential amplifier circuit as set forth in claim 23, wherein the feedback loop comprises:
   a first feedback transistor having a gate, drain and source node, said source node of the first feedback transistor coupled to the supply voltage and said gate node of the first feedback transistor coupled to a drain node of the bias load transistor;
   a resistor coupled between ground and the drain node of the first feedback transistor; and
   a second feedback transistor having a gate, drain and source node, said source node of the second feedback transistor coupled to the drain node of the bias load transistor, said drain node of the second feedback transistor coupled to the current mirror, and the gate node of the second feedback transistor coupled to the resistor and the drain node of the first feedback transistor.

29. The differential amplifier circuit as set forth in claim 24, wherein the feedback loop comprises:
   a first feedback transistor having a gate, drain and source node, said drain node of the first feedback transistor coupled to the ground and said gate node of the first feedback transistor coupled to the source node of the bias load transistor;
   a second feedback transistor having a gate, drain and source node, said drain node of the second feedback transistor coupled to the source node of the first feedback transistor, said source node of the second feedback transistor coupled to said first supply voltage; and
   a third feedback transistor having a gate, drain and source node, said drain node of the third feedback transistor coupled to the source of the bias load transistor, said source node of the third feedback transistor coupled to the current mirror, and the gate node of the third feedback transistor coupled to the drain node of the second feedback transistor and the source node of the first feedback transistor.

30. The differential amplifier circuit as set forth in claim 22, wherein said current mirror comprises a first current mirror transistor and second current mirror transistor, each transistor having a gate, first and second node, said gate nodes of each transistor coupled to the first node of the first transistor, said first node of the first transistor further coupled to the feedback loop to receive the current, said first node of the second current mirror transistor coupled to the differential pair of transistors, said second nodes coupled to a first potential.

31. The differential amplifier circuit as set forth in claim 30, wherein the differential output voltage is adjusted to be a product of a constant and a threshold voltage of a feedback loop transistor, a channel width of said second current mirror transistor being equal to the product of the constant and the channel width of the first current mirror transistor.

32. The differential amplifier circuit as set forth in claim 30, wherein the differential output voltage is adjusted to be a product of a constant and a threshold voltage of a feedback loop transistor, a channel width of said bias load transistor being equal to the product of the constant and the channel width of a second load transistor of the differential pair of transistors.

33. In a differential amplifier circuit comprising a pair of amplifier transistors having load transistors, said circuit receives as input a first input voltage and a second input voltage and outputs a differential output voltage indicative of which input voltage is greater, a method for biasing the circuit that stabilizes the differential output against variations in supply voltage and transistor transconductance, said method comprising the steps of:
  connecting a bias load transistor to the load transistors, said bias load transistor approximately equal in size to sizes of the load transistors, a gate node of the bias load transistor coupled to gate nodes of the load transistors;
  maintaining a predetermined voltage at a first node of the bias load transistor and a current through a feedback path, said feedback loop maintaining said predetermined voltage at the first node of the bias load transistor independent of variations of said supply voltage and transconductance of transistors in the circuit, and
  mirroring the current to the pair of amplifier transistors to provide a constant current value through said pair of amplifier transistors;
  wherein the differential output is stabilized against variations in said supply voltage and transistor transconductance.

* * * * *